(12) United States Patent
Shiga

(10) Patent No.: US 7,522,452 B2
(45) Date of Patent: Apr. 21, 2009

(54) NON-VOLATILE SEMICONDUCTOR STORAGE DEVICE

(75) Inventor: Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 11/769,383

(22) Filed: Jun. 27, 2007

(65) Prior Publication Data

US 2008/0013371 A1  Jan. 17, 2008

(30) Foreign Application Priority Data

Jun. 28, 2006 (JP) .............................. 2006-177529

(51) Int. Cl.
*G11C 16/04* (2006.01)
(52) U.S. Cl. .............................. 365/185.09; 365/185.11
(58) Field of Classification Search ............ 365/185.09, 365/185.11, 200
See application file for complete search history.

(56) References Cited

U.S. PATENT DOCUMENTS 5,428,569 A * 6/1995 Kato et al. ............. 365/185.26

6,549,464 B2 * 4/2003 Tanaka et al. .......... 365/185.22
7,164,601 B2 * 1/2007 Mitani et al. ........... 365/185.03

FOREIGN PATENT DOCUMENTS

JP 2001-195892 7/2001

* cited by examiner

Primary Examiner—Vu A Le
(74) Attorney, Agent, or Firm—Oblon, Spivak, McClelland, Maier & Neustadt, P.C.

(57) ABSTRACT

A memory cell array includes a plurality of memory cells enabled to store multi-value data. A bit-line control circuit includes data storage circuits connected to bit-lines and each store one of a plurality of sets of page data included in the multi-value data, the bit-line control circuit controlling bit-line voltages applied to the bit-lines. A word-line control circuit controls a word-line voltage applied to a word-line. A control circuit controls the word-line control circuit and the bit-line control circuit. The control circuit performs a mode in which, to distinguish a fault block, all or specific memory cells in a fault block may be written so that all or specific memory cells in the fault block have a threshold voltage higher than a word-line voltage applied to a selected word-line when reading a first page data of the sets of page data.

12 Claims, 15 Drawing Sheets

LOWER PAGE READ OPERATION

UPPER PAGE READ OPERATION

NON-VOLATILE SEMICONDUCTOR STORAGE DEVICE

CROSS REFERENCE TO RELATED APPLICATIONS

This application is based on and claims the benefit of priority from prior Japanese Patent Application No. 2006-177529, filed Jun. 28, 2006, the entire contents of which are incorporated herein by reference.

BACKGROUND OF THE INVENTION

1. Field of the Invention

The present invention relates to a non-volatile semiconductor storage device, and particularly, to a nonvolatile semiconductor storage device enabled to store two bit or more data in one memory cell.

2. Description of the Related Art

One of the well-known non-volatile semiconductor storage devices is a NAND cell type flash memory. The NAND cell type flash memory includes a memory cell array including a plurality of NAND cell units. Each NAND cell unit includes a plurality of memory cells connected in series and two selection transistors connected to both ends thereof. The memory cell holds, in an erase state, data "1" having a negative threshold voltage. In a data write operation, a floating gate is injected with electrons to rewrite data "0" having a positive threshold voltage. The NAND cell type flash memory may change the threshold voltage only from a lower value to a higher value in a data write operation, and may change the threshold voltage in the reverse direction (from a higher value to a lower value) only by an erase operation per a block.

For the purpose of increasing the memory capacity, a so-called multi-value NAND cell type flash memory has recently been developed, which stores two bit or more data in one memory cell. By way of example, a four-value NAND cell type EEPROM may store four-value (two-bit) data ("00," "01," "10," and "11") in a memory cell.

An n-value NAND cell type EEPROM includes a plurality of latch circuits per a single bit-line connected to the selected memory cell (see, for example, JP 2004-192789 (paragraphs from 0025 to 0139 and others). Specifically, when n-value data is written or read to or from the selected memory cell, the latch circuits serve to temporarily store the n-value data. For a four-value NAND cell type EEPROM, for example, in a write or a read operation, four-value (two-bit) data is temporarily stored in two latch circuits provided per one bit-line connected to the selected memory cell.

For the NAND cell type flash memory, an operation test is done to determine whether data write, erase, and read operations from the memory cell are successfully performed. When the result of the operation test shows a fault of a memory cell, the block including the cell is recognized as a fault block, and the subsequent access to the block is prohibited.

In a binary storage NAND cell type flash memory, as fault-block data for indicating a fault block, "0" data is written to all. (or specific (the several bits at the top, for example)) memory cells in the fault block. The "0" data group functions as the fault-block data indicating the fault block. For a multi-value storage (for example, four-value storage) NAND cell type flash memory, writing "0" data to one page in all (or specific) memory cells included in the fault block, for example, may make it possible to write the fault-block data. The multi-value storage has a problem, however, that it has a complicated write process or it needs to control the threshold voltage in a narrow range, thus making it difficult to write the written fault-block data with a high reliability.

SUMMARY OF THE INVENTION

A non-volatile semiconductor storage device according to an aspect of the present invention comprises: a memory cell array comprising a plurality of memory cells enabled to store multi-value data, the memory cells being arranged along a plurality of bit-lines and a plurality of word-lines; a bit-line control circuit including data storage circuits connected to the respective bit-lines and each storing one of a plurality of sets of page data included in the multi-value data, the bit-line control circuit controlling bit-line voltages applied to the bit-lines; a word-line control circuit that controls word-line voltages applied to the word-lines: and a control circuit that controls the word-line and bit-line control circuits according to a control signal from outside, the control circuit being able to perform a mode in which, to distinguish a fault block in the memory cell array, all or specific memory cells in the fault block are written so that all or specific memory cells in the fault block have a threshold voltages higher than a word voltage applied to a selected word line when reading a first page of the sets of page data.

DETAILED DESCRIPTION OF THE EMBODIMENTS

With reference to the accompanying drawings, preferred embodiments of the present invention will be described in more detail with respect to an example of a four-value NAND cell type flash memory,

[Basic Principle]

Figure 1:
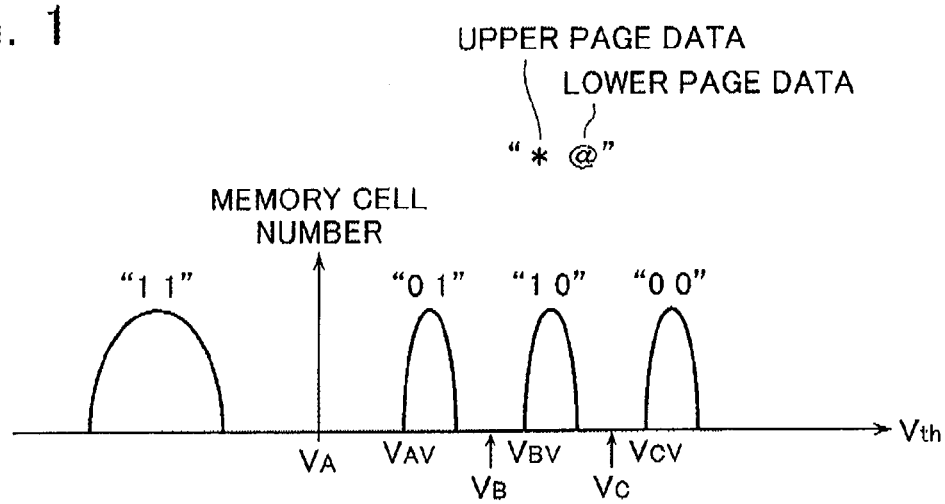
FIG. 1 shows an example of write data in a four-value storage flash memory.

A four-value NAND cell type flash memory is adapted to allow its one memory cell to have a threshold voltage having four types of distributions. FIG. 1 shows two-bit, four-value data (data "11," "10," "01," and "00") stored in a memory cell of the four-value NAND cell type flash memory and a distribution of a threshold voltages (Vth) of a memory cell. Note that in FIG. 1, VA, VB, and VC are voltages applied to selected word-lines when reading four sets of data, and VAv, VBv, and VCv indicate verify voltages.

A memory cell after a block erasure is indicated as data "11." The memory cell has a negative threshold voltage Vth. Memory cells containing data "01," "10," and "00" in a write state have a positive threshold voltage Vth. The data "01" in a write state has the lowest threshold voltage. The data "00" has the highest threshold voltage. The data "10" has a threshold voltage between the voltages of data "01" and data "00."

The two-bit data in one memory cell includes lower page data and upper page data. The lower and upper page data are written to the memory cell by different write operations, specifically, by two write operations. In an expression of data "*@," "*" indicates the upper page data, and "@" indicates the lower page data.

The lower page data write operation is first described with reference to FIG. 2. It is assumed that all memory cells are in an erase state, i.e., they have data "11." Referring to FIG. 2, when the lower page data is written, the threshold voltage Vth of the memory cell is divided into two distributions depending on the lower page data ("1" or "0"). When, specifically, the lower page data is "1," the tunnel oxide layer of the memory cell is not applied with a high electric field, thus suppressing increase of the threshold voltage Vth of the memory cell. The memory cell thus maintains the erase state data (data "11").

When the lower page data is "0," the tunnel oxide layer of the memory cell is applied with a high electric field to inject electrons to the floating gate electrode. The threshold voltage Vth of the memory cell is thus increased by a predetermined amount. Specifically, the verify potential VBv' is set, and the write operation is repeated until the threshold voltage equals the verify potential VBv' or more. The memory cell thus changes to the write state (data "10"). Note that the data "10" has a wider threshold voltage distribution than that of the data "11" because the write operation affects the adjacent cells.

The upper page data write operation is now described with reference to FIG. 3. The upper page data is written according to write data (upper page data) input from outside the chip and lower page data already written to the memory cell.

Figure 3:
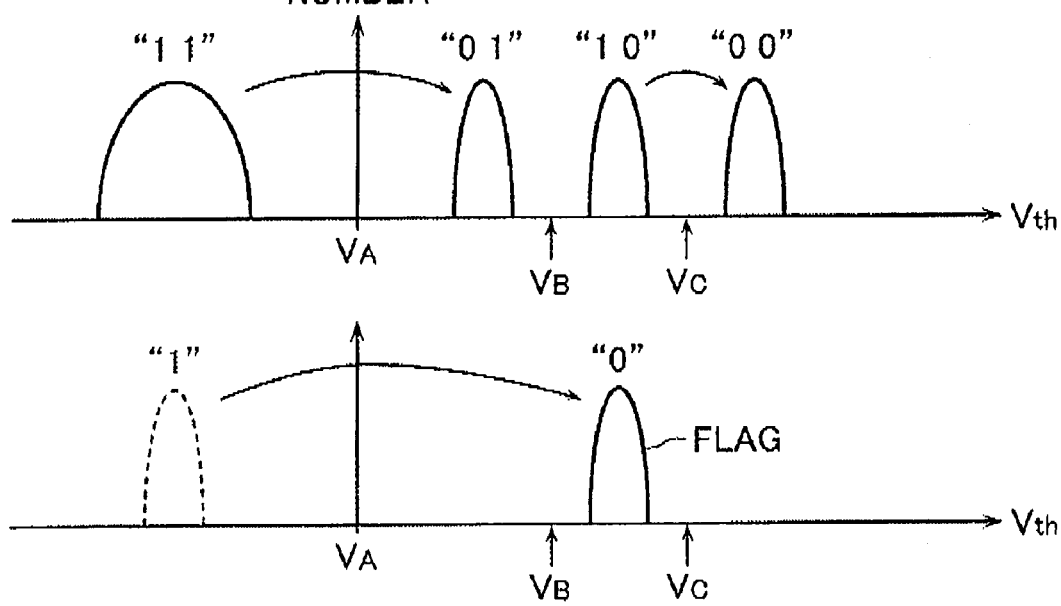
FIG. 3 is another schematic diagram of a data write process in a four-value storage flash memory.

Referring to FIG. 3, specifically, when the upper page data is "1," the tunnel oxide layer of the memory cell is not applied with a high electric field, thus suppressing increase of the threshold voltage Vth of the memory cell. The memory cell of data "11" (erase state) thus maintains the data "11," and the memory cell of data "01" maintains the data "01."

When the upper page data is "0," the tunnel oxide layer of the memory cell is applied with a high electric field to inject electrons to the floating gate electrode. The threshold voltage Vth of the memory cell is thus increased by a predetermined amount. The memory cell of data "11" (erase state) thus changes to data "01," and the memory cell of data "10" changes to data "00."

The above operations may be summarized as follows.

(1) When the lower page data is "1" and the upper page data is "1," the erase state cell maintains the data "11."
(2) When the lower page data is "0" and the upper page data is "1," the data "10" is written to the memory cell.
(3) When the lower page data is "1" and the upper page data is "0," the data "01" is written to the memory cell.
(4) When the lower page data is "0" and the upper page data is "0," the data "00" is written to the memory cell.
(5) The write operations of (1) to (4) each include two write operations; the first lower page data write operation and the subsequent higher page data write operation.

It is necessary to store, in any storage means, data indicating whether the memory cell MC is at the stage where the lower page data write operation has been ended and the upper page data write operation has not been ended yet, or at the stage where the lower page data write operation has been ended and the upper page data write operation also has been ended. This is indicated by flag data FLAG stored in a memory cell (flag cell) similar to a memory cell that stores data. Referring to FIGS. 2 and 3, when the memory cell is at the former stage, the flag data FLAG is "1" (a negative threshold voltage), and when the memory cell is at the latter stage, the flag data FLAG is "0" (a threshold voltage of VB or more).

[Memory Configuration]

Figure 4:
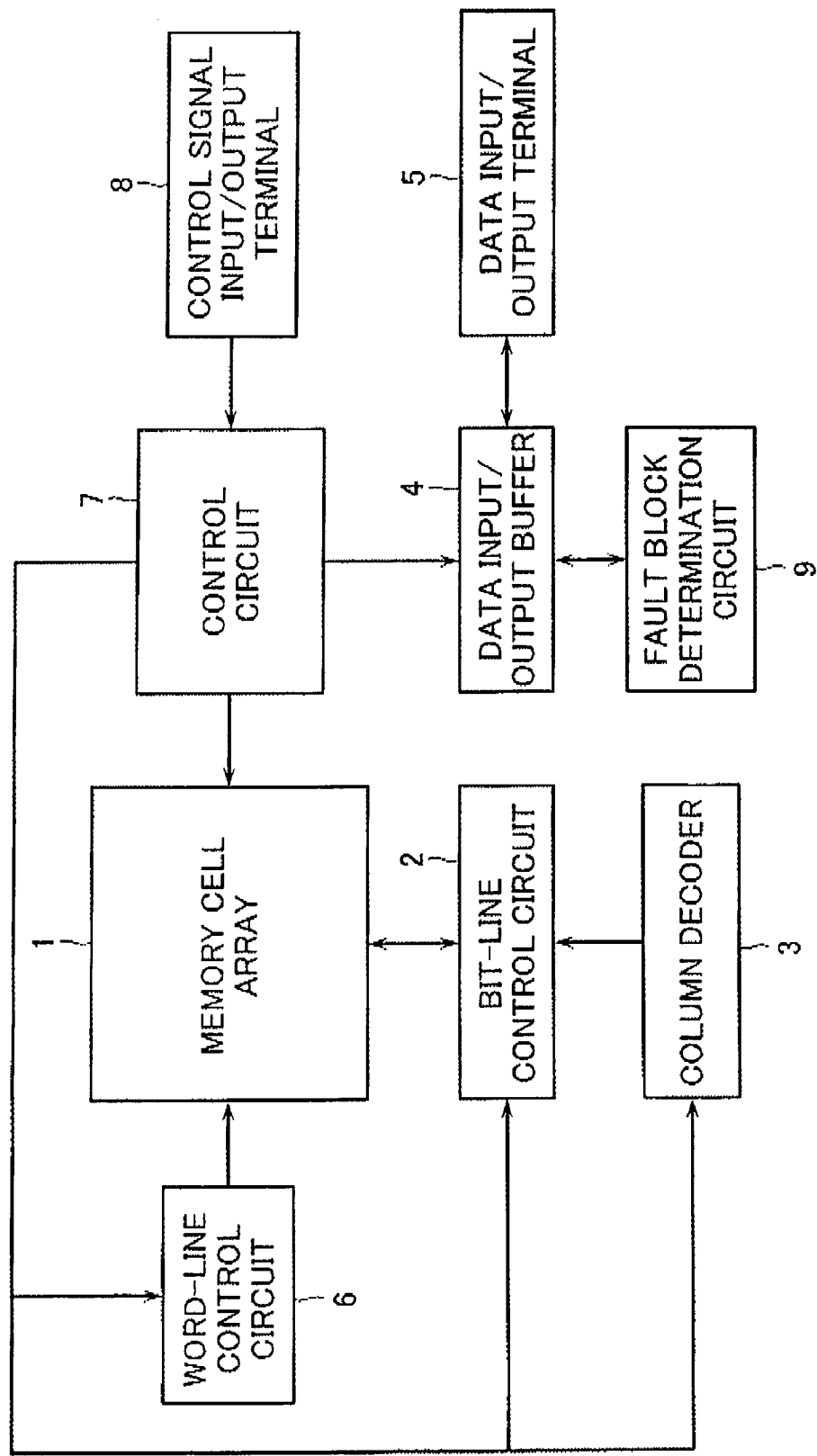
FIG. 4 is a schematic diagram of a configuration of a NAND cell type flash memory according to a first embodiment of the present invention.

FIG. 4 shows, as an example of a non-volatile semiconductor storage device, a configuration of a NAND cell type flash memory that stores four-value (two-bit) data. The flash memory includes a memory cell array 1. The array 1 includes memory cells that store data. The memory cells are arranged in a matrix. The memory cell array I includes a plurality of bit-lines, a plurality of word-lines, and a common source line. The array 1 includes memory cells that may electrically rewrite data. The memory cells are arranged in a matrix at the intersection points of the bit-lines and the word-lines. Connected to the memory cell array tare a bit-line control circuit 2 to control the bit-line and a word-line control circuit 6 to control the word-line voltage. The bit-line control circuit 2 reads, via the bit-line, data of the memory cell in the memory cell array 1. The control circuit 2 also writes data, via the bit-line, in the memory cell in the memory cell array 1 by applying a write control voltage to the memory cell.

Connected to the bit-line control circuit 2 are a column decoder 3, a data input-output buffer 4, and a data input-output terminal 5. After being read from the memory cell array 1, the data of the memory cell is output outside, via the bit-line control circuit 2 and the data input-output buffer 4, from the data input-output terminal 5. After being input to the data input-output terminal 5 from the outside, the write data is input, via the data input-output buffer 4, to the bit-line control circuit 2 by the column decoder 3. A specified memory cell is thus written.

The memory cell array 1, the bit-line control circuit 2, the column decoder 3, the data input-output buffer 4, and the word-line control circuit 6 are connected to a control circuit 7. The control circuit 7 generates, according to a control signal input to a control signal input terminal 8, a control signal and a control voltage to control the memory cell array 1, the bit-line control circuit 2, the column decoder 3, the data input-output buffer 4, and the word-line control circuit 6.

Connected to the data input-output buffer 4 is a fault block determination circuit 9. The determination circuit 9 determines, according to the read data, whether the block to be read is a fault block.

Figure 5:
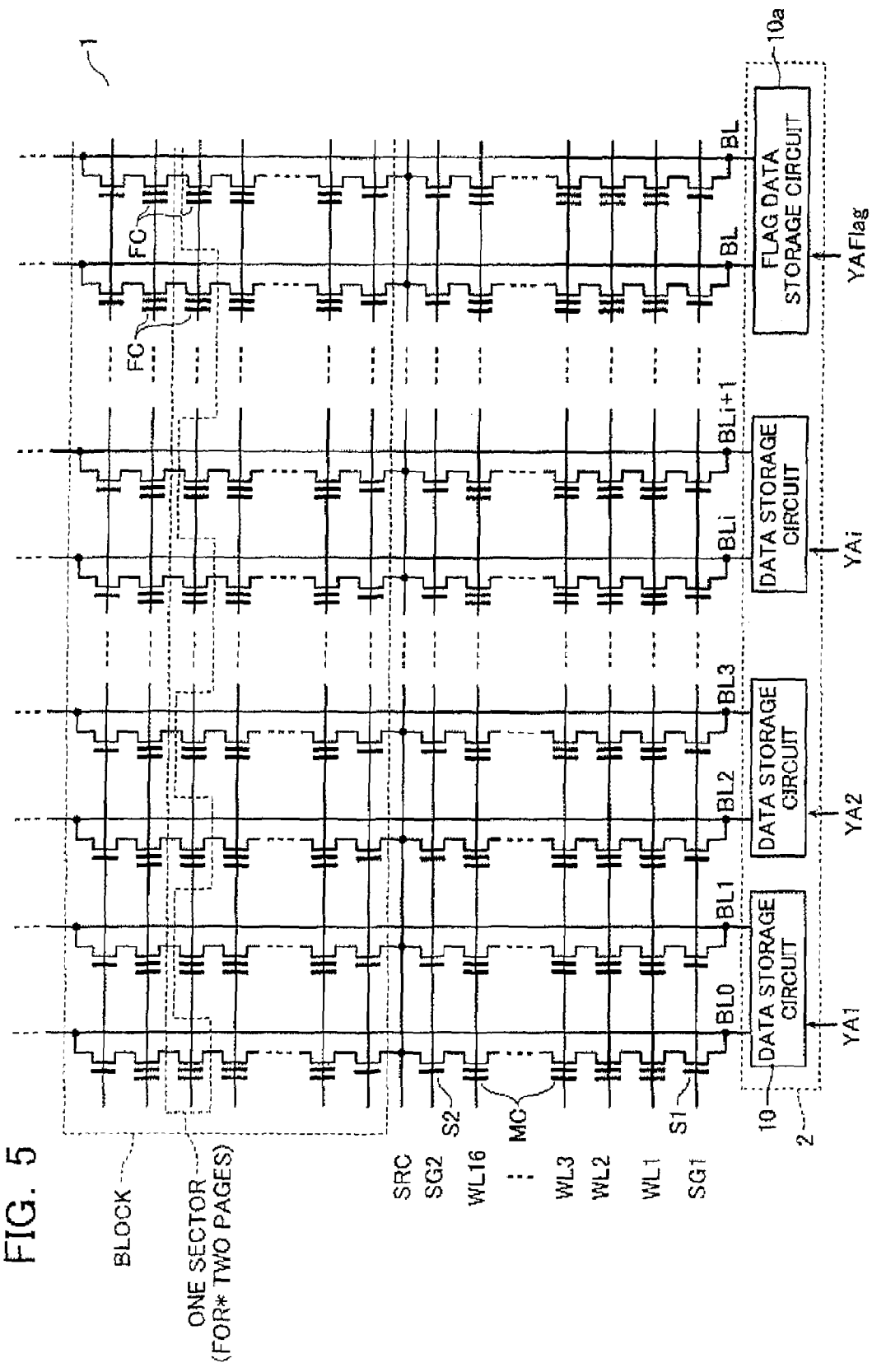
FIG. 5 is a circuit diagram of a configuration of the memory cell array 1 and the bit-line control circuit 2 in FIG. 4.

FIG. 5 shows configurations of the memory cell array 1 and the bit-line control circuit 2 in FIG. 4. The memory cell array 1 is a NAND cell type memory cell array. The array 1 includes a plurality of NAND cells. One NAND cell includes memory cells MC comprising, for example, 16 EEPROMs connected in series and selection gates S1 and S2 connected to both ends thereof. The selection gate S1 is connected to a bit-line BL0. The selection gate S2 is connected to a source line SRC.

The memory cell MCs arranged on the same row have control gates that is commonly connected to word-lines WL1, WL2, and WL3 to WL16. The first selection gates S1 is commonly connected to a select line SG1. The second selection gates S2 is commonly connected to a select line SG2.

The memory cell array 1 includes, as shown by a broken line, a plurality of blocks. Each block includes a plurality of NAND cells. Data is erased per a block. The erase operation is performed at the same time on two bit-lines connected to a data storage circuit 10 or a flag data storage circuit 10a.

The bit-line control circuit 2 includes a plurality of the data storage circuits 10 and the flag data storage circuit 10a. Connected to the data storage circuits 10 and the flag data storage circuit 10a are respective pairs of bit-lines (BL0 and BL1), (BL2 and BL3) . . . (BLi and BLi+1), and (BL and BL). Each data storage circuit 10 has a function of holding data read from the memory cell MC. The storage circuit 10 also has a function of holding data to be written to the memory cell MC. The storage circuit 10 also serves to operate internal data in multi-value data storage, as described below.

A plurality of memory cells (enclosed by a broken line) form one sector. The memory cells in one sector are arranged on every other bit-line and are connected to one word-line. Data is written to and read from each sector. One sector stores, for example, two-page data. Connected to each word-line is a flag cell FC to store the flag data FLAG. The flag cell FC stores the flag data FLAG. The flag data FLAG is "1" when the lower page data write operation has been ended in the memory cell MC. The flag data FLAG is "0" when the upper page data write operation has been ended.

In a read operation, a program verify operation, and a program operation, one bit-line is selected from the two bit-lines (BLi and BLi+1) connected to the data storage circuit 10 according to the address signal (YA1, YA2, . . . , YAi, and YAflag) specified from the outside. Also, according to the external address, one word-line is selected and one sector (for two pages) is selected. Switching between the two pages is performed according to the address.

Figure 6:
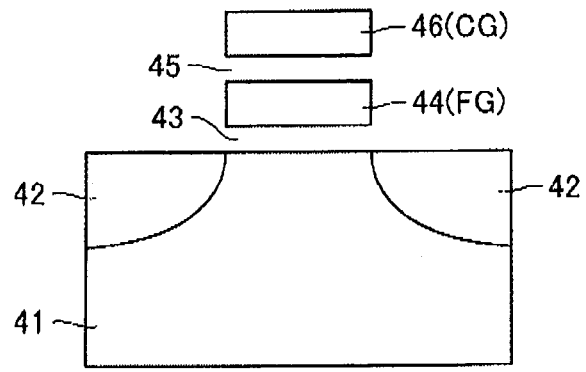
FIG. 6 is a cross sectional view of the memory cell MC in FIG. 5.
Figure 7:
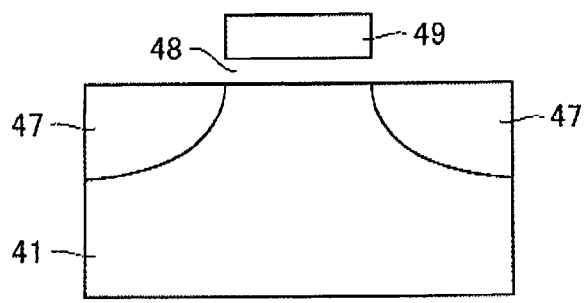
FIG. 7 is a cross sectional view of the selection gates S1 and S2 in FIG. 5.

FIGS. 6 and 7 show cross-section structures of the memory cell MC and the selection gates S1 and S2. FIG. 6 shows a cross-section structure of the memory cell MC. The substrate 41 has n-type diffusion layers 42 formed therein. The diffusion layers 42 function as a source and a drain of MOSFET included in the memory cell MC, respectively. The substrate 41 also has a floating gate (FG) 44 formed thereon via a gate-insulating layer 43. The floating gate 44 has a control gate (CG) 46 formed thereon via the insulating layer 45.

The selection gates S1 and S2 each include a substrate 41 and n-type diffusion layers 47 formed in the substrate 41. The diffusion layers 47 serve as a source and a drain, respectively. The substrate 41, has a control gate 49 formed thereon via a gate-insulating layer 48.

Figure 8:
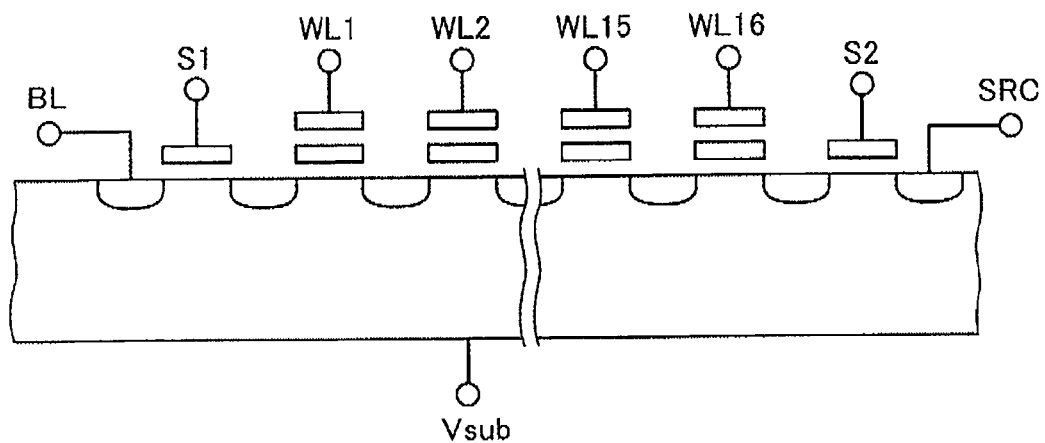
FIG. 8 is a cross sectional view of one NAND cell in a memory cell array.

FIG. 8 shows a cross section of one NAND cell in the memory cell array. In this example, the one NAND cell includes 16 memory cells MC connected in series, each having a configuration in FIG. 6. The NAND cell includes, on its drain side and source side, the first selection gates S1 and S2 each having a configuration in FIG. 7.

Figure 9:
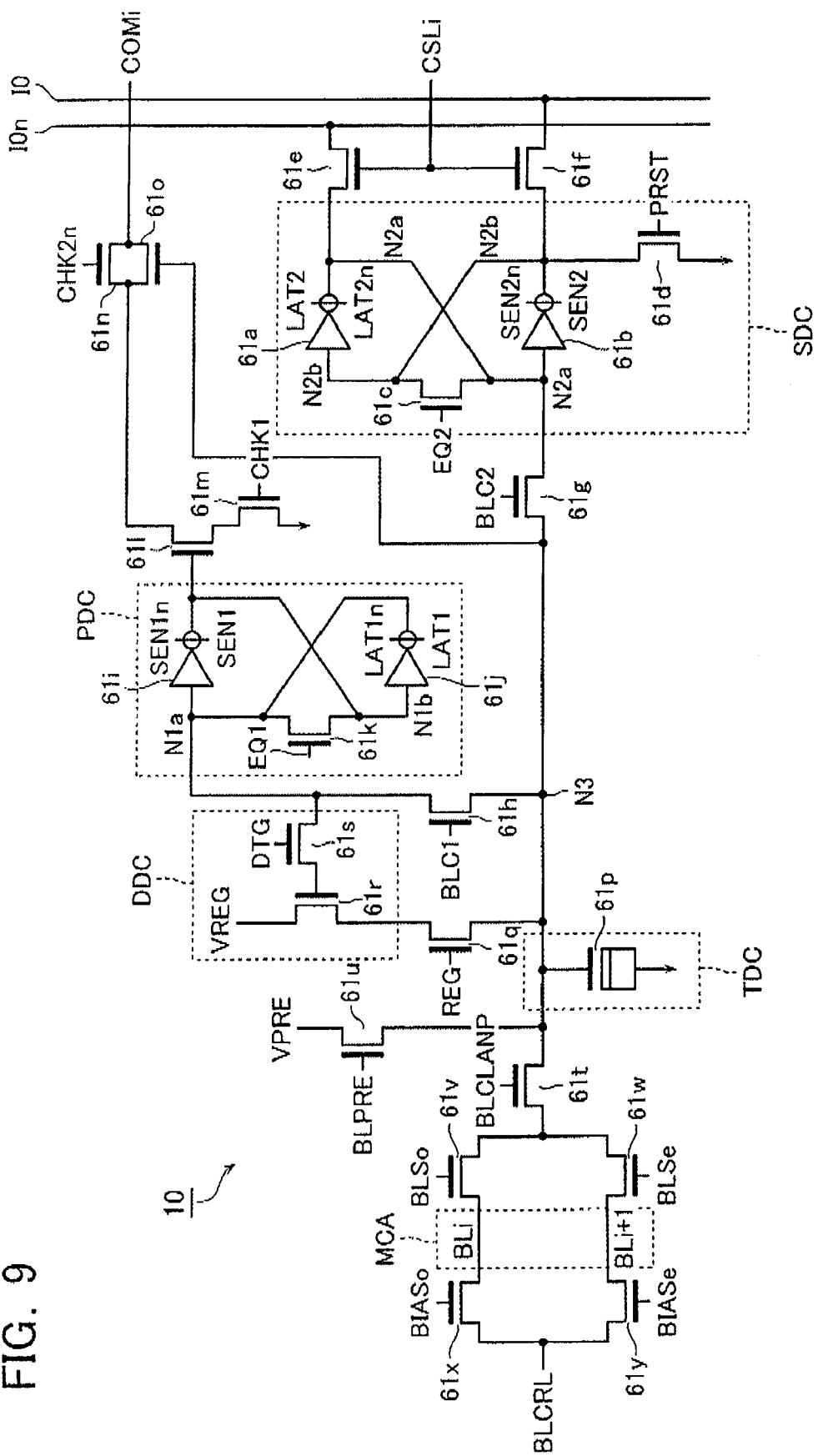
FIG. 9 is a circuit diagram of an example configuration of the data storage circuit 10 in FIG. 5.

An example configuration of the data storage circuit 10 is described below with reference to FIG. 9. Note that the data storage circuit 10a has a similar configuration to the circuit 10, so its description is omitted here. The data storage circuit 10 includes a primary data cache (PDC), a secondary data cache (SDC), a dynamic data cache (DDC), and a temporary data cache (TDC).

The SDC, PDC, and DDC hold input data in a write operation, hold read data in a read operation, temporarily hold data in a verify operation, and are responsible for data storage to operate internal data in multi-value data storage. The TDC amplifies bit-line data and temporarily holds the data in a data read operation. The TDC is also used to operate internal data in multi-value data storage.

The SDC includes clocked inverter circuits 61a and 61b and transistors 61c and 61d. The inverter circuits 61a and 61b make up a latch circuit. The transistor 61c is connected between the input terminals of the clocked inverter circuits 61a and 61b. The transistor 61c receives at its gate a signal EQ2.

The transistor 61d is connected between the output terminal of the clocked inverter circuit 61b and the ground. The transistor 61d receives at its gate a signal PRST.

The SDC has a node N2a (the output terminal of the clocked inverter circuit 61a). The node N2a is connected, via a column selection transistor 61e, to an input-output data line 10n. The SDC also has a node N2b (the output terminal of the clocked inverter circuit 61b). The node N2b is connected, via a column selection transistor 61f, to an input-output data line 10. The column selection transistors 61e and 61f receive at their gates a column selection signal CSLi.

The PDC includes clocked inverter circuits 61i and 61j and a transistor 61k. The inverter circuits 61i and 61j make up a latch circuit. The transistor 61k is connected between the input terminals of the clocked inverter circuits 61i and 61j. The transistor 61k receives at its gate a signal EQ1. A node N1a of the PDC and the node N2a of the SDC are connected via transistors 61g and 61h. The transistor 61g receives at its gate a signal BLC2. The transistor 61h receives at its gate a signal BLC1.

The PDC also has a node N1b (the input terminal of the clocked inverter circuit 61j). The node N1b is connected to the gate of a transistor 61l. The current path of the transistor 61l has one end grounded via a transistor 61m. The transistor 61m receives at its gate a signal CHK1. The current path of the transistor 61l has the other end connected to one ends of the current paths of transistors 61n and 61o both making up a transfer gate. The transistor 61n receives at its gate a signal CHK2n. The gate of the transistor 61o is connected to a connection node between the transistors 61g and 61h.

The current paths of the transistors 61n and 61o have the other ends supplied with a signal COMi. The signal COMi is a signal common to all data storage circuits 10. The signal COMi indicates whether verification of all data storage circuits 10 is complete. After the verification is complete, the node N1b of the PDC changes to "L," as described below. In this condition, changing the signals CHK1 and CHK2n to "H," causes the signal COMi to become "H", if the verification is complete.

The TDC includes, for example, a MOS capacitor 61p. The MOS capacitor 61p is connected between the ground and a connection node N3 between the transistors 61g and 61h. Connected to the connection node N3, via a transistor 61q, is the DDC. The transistor 61g receives at its gate a signal REG.

The DDC includes transistors 61*r* and 61*s*. The current path of the transistor 61*r* has one end supplied with a signal VREG. The current path has the other end connected to the current path of the transistor 61*g*. The gate of the transistor 61*r* is connected via the transistor 61*s* to the node N1*a* of PDC. The transistor 61*s* receives at its gate a signal DTG.

Also connected to the connection node N3 are one ends of the current paths of transistors 61*t* and 61*u*. The current path of the transistor 61*u* has the other end supplied with a signal VPRE. The transistor 61*u* receives at its gate a signal BLPRE.

The transistor 61*t* receives at its gate a signal BLCLAMP. The current path of the transistor 61*t* has the other end connected via a transistor 61*v* to a bit-line BLi. The other end is also connected via a transistor 61*w* to a bit-line BLi+1.

The bit-line BLi has the other end connected to one end of the current path of a transistor 61*x*. The transistor 61*x* receives at its gate a signal BlASo. The bit-line BLi+1 has the other end connected to one end of the current path of a transistor 61*y*. The transistor 61*y* receives at its gate a signal BlASe. The current paths of the transistors 61*x* and 61*y* have the other ends supplied with a signal BLCRL. The transistor 61*x* and 61*y* turn on, according to the signals BlASo and BlASe, in a complementary manner with the transistors 61*v* and 61*w*. The transistor 61*x* and 61*y* supply the unselected bit-line with the potential of the signal BLCRL.

[Write Operation and Verify Operation]

The multi-value write operation and the write verify operation in the NAND cell type flash memory is described with reference to FIGS. 10 and 11. The write operation is performed in two stages; the lower page data write operation and the upper page data write operation.

Figure 10:
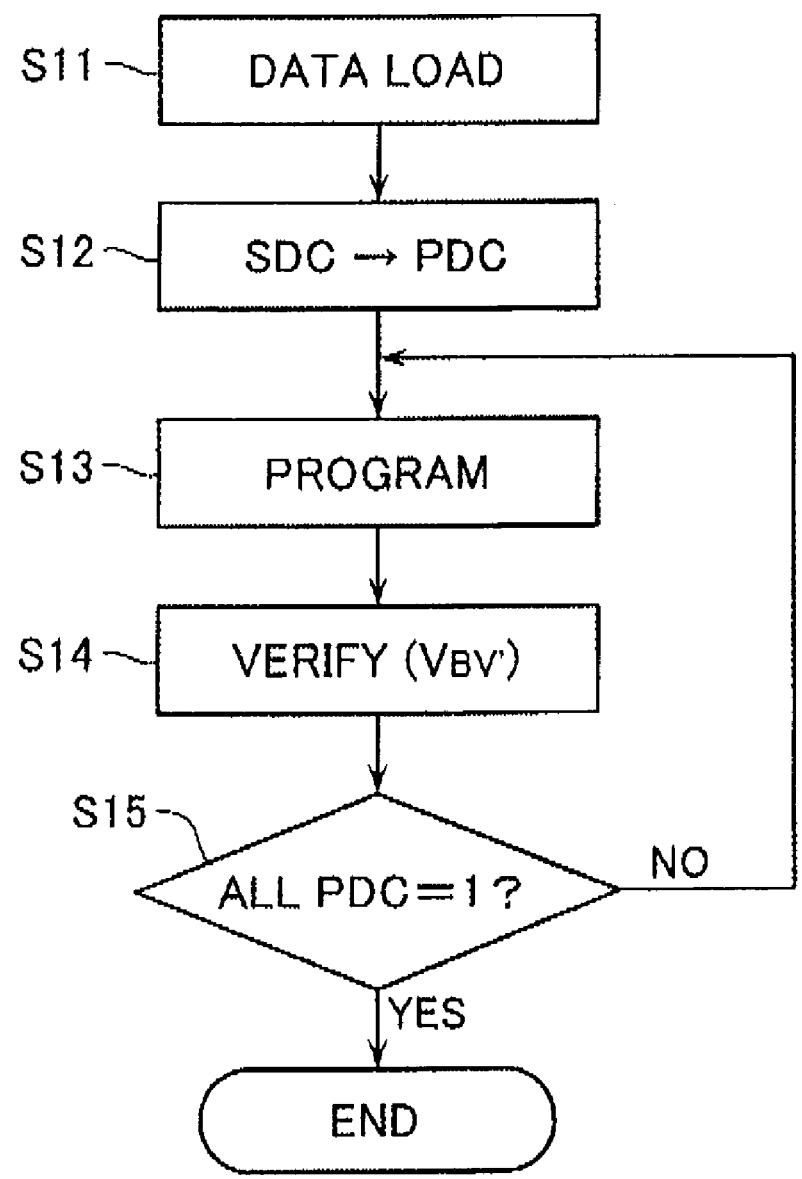
FIG. 10 is a flowchart of a write process of lower page data included in four-value data.
Figure 11:
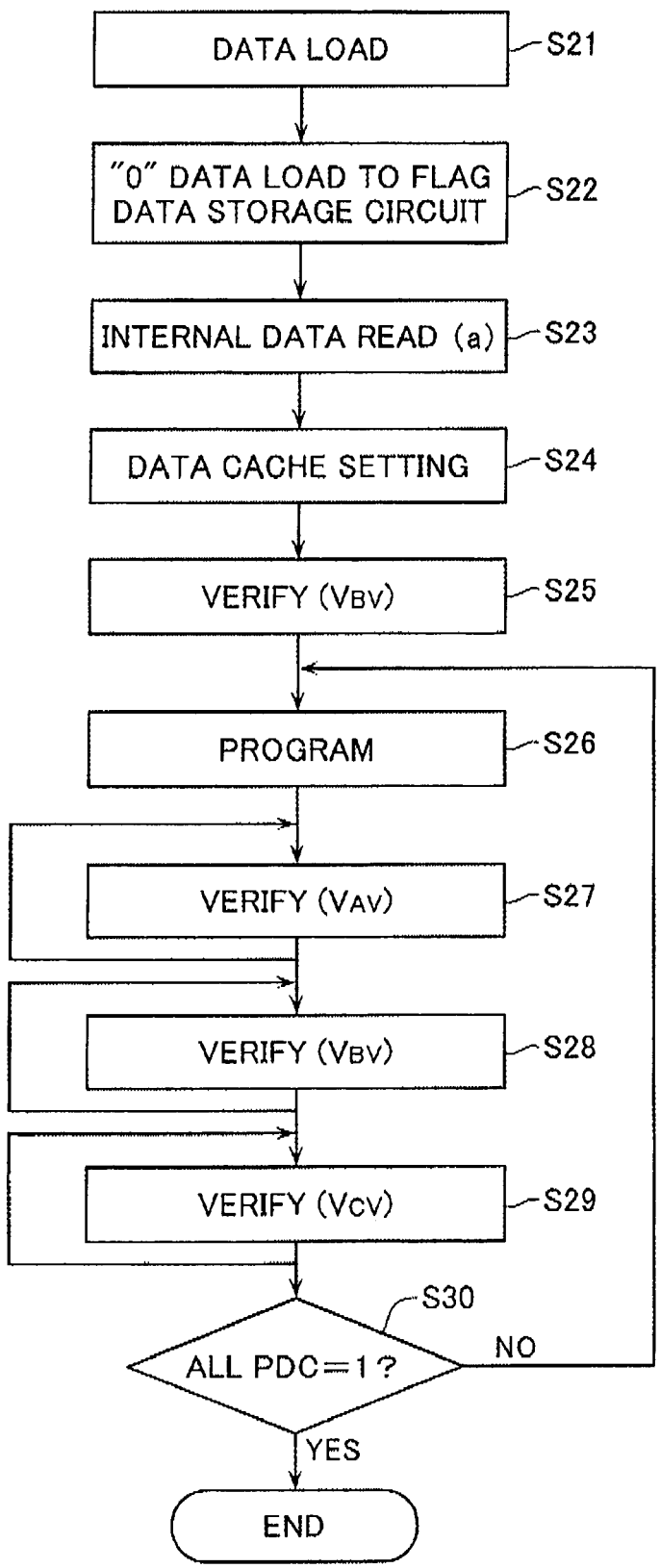
FIG. 11 is a flowchart of a write process of upper page data included in four-value data.

Referring to FIG. 10, first to select a lower page of one sector in FIG. 5, an address is assigned, and write data is input from the outside and stored in the SDC in all data storage circuits 10 (S11).

A write command input may turn on the transistors 61*h* and 61*g*, thus transferring data of the SDC to the PDC in all data storage circuits 10 (S12). When data "1" is input from the outside as the lower page data, the node N1*a* of the PDC changes to "H." When data "0" is input, the node N1*a* of the PDC changes to "L." Note that in the lower page data write operation, no data is written to the flag cell FC. The PDC in the flag data storage circuit 10*a* thus has data "1."

The operation then shifts to a memory cell MC write (program) operation (S13). Specifically, the transistors 61*h*, 61*t*, and 61*v* or 61*w* turn on, thus supplying data held in the PDC to the bit-line BLi or BLi+1. When the PDC holds data "1," the bit-line changes to Vdd. When the PDC holds data "0," the bit-line changes to Vss (ground potential). To avoid the unselected page cells from being written, the unselected page bit-lines are also supplied with Vdd.

The select line SG1 of the selected block is applied with Vdd. The word-line of the selected cell is applied with a potential VPGM (20V). The word-line of the unselected cell is applied with a potential VPASS (10V). This allows the write operation to the selected cells and avoids the write operation to the unselected cells.

The operation then shifts to a write verify operation (S14). First, the unselected word-line and the select line SG1 are provided with a potential Vread for a read operation, and the bit-line is precharged to 1V. The selected word-line is provided with the verify potential VBv'. The select line SG2 on the source side of the memory cell is changed to "H." When the selected memory cell MC has a threshold voltage higher than the verify potential VBv', the memory cell MC maintains the off state, thus leaving the bit-line "H." When the selected memory cell MC has a threshold voltage lower than the verify potential VBv', the memory cell MC turns on, thus changing the bit-line to "L." The node N3 of the TDC changes to "L" when the bit-line is "L." The node N3 changes to "H" when the bit-line is "H."

When the DDC is written with "0," it stores "L." When the DDC is not written with "0," it stores "H." When the signal VREG is set to Vdd and the signal REG is set to "H," the node N3 of the TDC is forced to be "H" only when the DDC is not written with "0." Then the PDC's data is transferred to the DDC, and the TDC's potential is transferred to the PDC.

Under the above operations, when the PDC is "L," the write operation is performed again, and the program operation and the verify operation are repeated until all data storage circuits 10 have data "H" (S15-S13). When thereafter the adjacent memory cells are written sequentially, the threshold voltage of the memory cell rises depending on the write data due to the FG to FG capacitance, thus spreading the threshold voltage distribution of the data "10" toward the higher direction.

The upper page data write (program) operation is now described with reference to FIG. 11. Also in the upper page data write operation, an address is first assigned, and then write data is input from the outside and stored in the SDC in all data storage circuits 10 (S21).

When, thereafter, the write command is input, the data "0" is written to the flag cell FC as the flag data FLAG, and the data "0" is input to the SDC in the flag cell data storage circuit 10*a* (S22).

The internal data is then read to determine whether data after the upper page is written is "11" (the lower page data is "1") or "10" (the lower page data is "0")(S23). The selected word-line is supplied with the potential VA (FIG. 1). The unselected word-line and the select line SG1 are supplied with the potential Vread.

When the memory cell has data of "10," the PDC latches "H." When the memory cell has data of "11," the PDC latches "L."

Thereafter, depending on whether data to be written is "11," "01," "10," or "00," data to be stored in each data cache SDC, PDC, TDC, or DDC is set (S24).

Then, before the write operation, the data "10" is verified (S25). Subsequently, similar to the lower page data write operation, the write operation is performed (S26).

Further, for the data "01," "10," and "00," the potential is set to VAv, VBv, and VCv, and the data is verified (S27 to S29). Until the PDC in all data storage circuits 10 has data of "H," the write and verify operations are repeated (S30).

[Read Operation]

The read operation is now described with respect to the lower page data read and the upper page data read.

Figure 12:
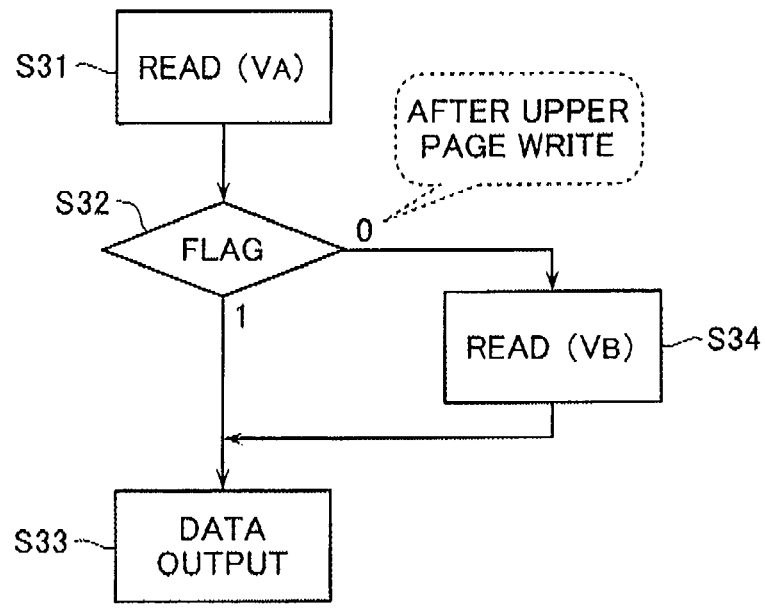
FIG. 12 is a flowchart of a read process of lower page data in four-value data.

FIG. 12 shows a flowchart of the process of the lower page data read. First, an address Is assigned to select one sector in FIG. 5. Then, the potential of the selected word-line is set to VA and the read operation is performed (S31), thus determining whether the flag cell FC has flag data FLAG of "0" or "1" (S32).

Figure 2:
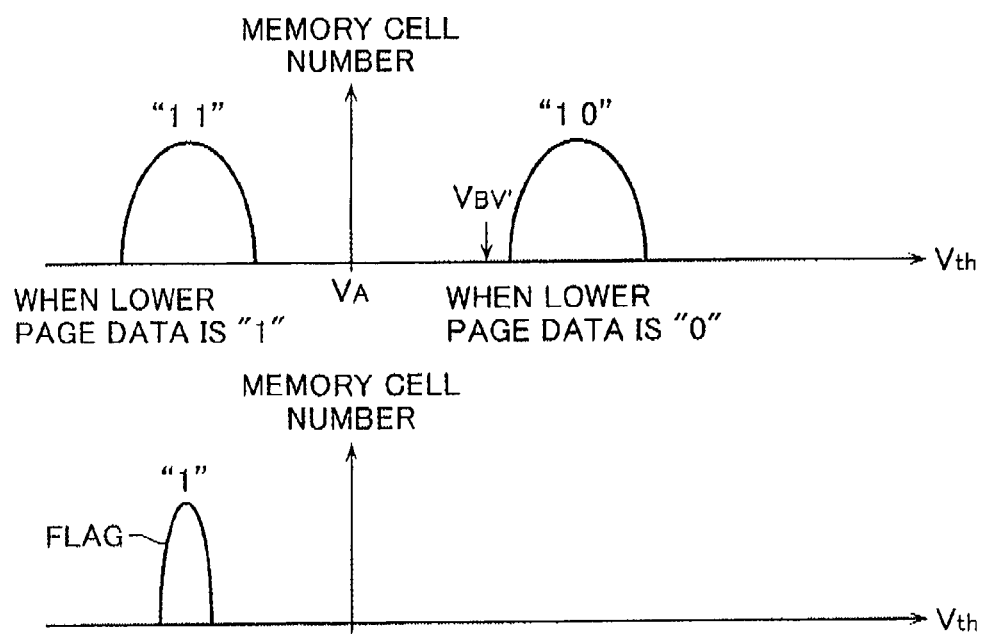
FIG. 2 is a schematic diagram of a data write process in a four-value storage flash memory.

When the flag data FLAG read from the flag cell FC is "1," the upper page data write operation is not complete, and the memory cell MC has a threshold voltage distribution as shown in FIG. 2. The data may be read with the word-line potential being set to VA. The data is thus already read to the data storage circuit 10. Therefore, the data stored in the data storage circuit 10 is output outside for reading (S33).

When the flag data FLAG read from the flag cell FC is "0" (the memory cell has data of "1"), the upper page data write operation is complete, so the memory cell MC has a threshold voltage distribution as shown in FIG. 3. Therefore, the word-line potential is set to VB and the read operation is performed (S34), and the data read to the data storage circuit 10 is output outside (S33). Each data cache in the data storage circuit 10 then has an operation similar to those in the write and verify operations.

Figure 13:
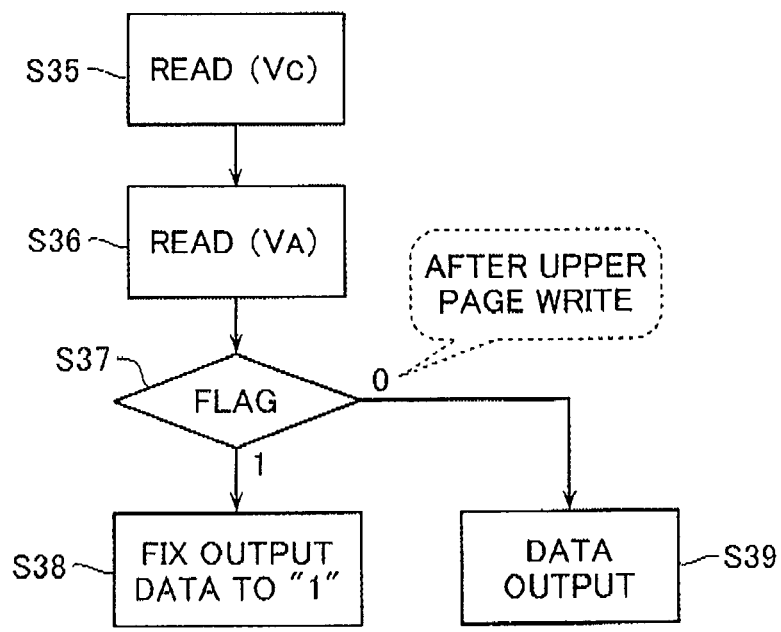
FIG. 13 is a flowchart of a read process of upper page data in four-value data.

The process of the upper page data read operation is described with respect to the flowchart in FIG. 13. In the upper page data read operation, an address is first assigned to select one sector in FIG. 5. Then the word-line potential is set to VC and the read operation is performed (S35). Then the word-line potential is set to VA and the read operation is performed (S36). Then it is determined whether the flag cell FC has flag data FLAG of "0" or "1" (S37).

When the flag cell FC has flag data FLAG of "1" indicating that the upper page write operation is not complete, the output data is fixed to "1" (S38). The output is set to "1" by setting the signal PRST in the data storage circuit 10 to "H" and setting the SDC to "1." Alternatively, the output is set to "1" by outputting only "1" from the data input-output buffer 4 shown in FIG. 4. When the flag cell has flag data FLAG of "0," the read data is output (S39).

[Fault-Block Data Write Mode]

The fault-block data write mode is described below. This mode is performed for a block that has been determined as a fault block in the write operation in FIGS. 10 and 11.

On writing fault-block data to a flash memory for the four-value data write operation as described in FIGS. 1 to 3, the following factors should be taken into account.
(1) what kind of fault-block data is written,
(2) how the fault-block data is read, and how a block can be judged as a fault block.
The fault-block data write process is preferably simple. It is also required to read the written fault-block data with a high reliability without misread or fault determination.

When, for example, all or specific memory cells in a block have the upper page data "0" written therein (data "01" or "00" shown in FIG. 1 is written), it is theoretically possible to determine that the relevant block is a fault block. In this case, however, the small difference with the threshold voltage of the data "10" may cause misread. The upper page data "0" write operation needs to be preceded by the lower page data write operation. This method may thus increase the number of steps in the fault-block data write process.

Also when, for example, all or specific memory cells in a block have the lower page data "0" written therein (data "10" or "00" shown in FIG. 1 is written), it is theoretically possible to determine that the relevant block is a fault block. Although, in this case, the misread is less likely to occur, the upper page data write operation is required to be complete, thus requiring the same number of steps in the write process as the above case.

In the present embodiment, therefore, at various stages in the data write process, the threshold voltages of all or specific memory cells in a fault block are rewritten so that the lower page data read operation as shown in FIG. 12 may determine the data "0."

Referring to FIGS. 12 and 13, the lower page read operation is simpler than the upper page read operation (the lower page read operation only needs one type of word-line voltage to read data in the memory cell MC). The lower page read operation is similar to the read operation of the normal one bit (binary) storage memory.

The fault-block data write operation may also start during the block data write process. In the flash memory for the write operations shown in FIGS. 1 to 3, the fault-block data write mode may start with the following three cases (states):
(case 1) the state before the lower page data write operation (before performing the flow in FIG. 10),
(case 2) the state after the lower page data write operation and before the upper page data write operation (after performing the flow in FIG. 10 and before performing the flow in FIG. 11), and
(case 3) the state after the upper page data write operation (after performing the flow in FIG. 11).

In case 1, all memory cells MC hold the erase state data "11," and the flag data FLAG is "1."

In case 2, the memory cells MC have a threshold voltage distribution of data "11" or "10" (a wide threshold voltage distribution) as shown in FIG. 2. The flag data FLAG is "1."

In case 3, the memory cells MC have the four types of threshold voltage distributions of data "11," "01," "10," and "00" as shown in FIG. 3. The flag data FLAG is "0."

In the present embodiment, when it is instructed to start the fault-block data write mode, in any of cases 1 to 3, the threshold voltages of all or specific memory cells in a fault block are rewritten to be higher than the read potential VB used in the lower page data read operation shown in FIG. 12. This is described below with reference to FIGS. 14 to 17.

Figure 14:
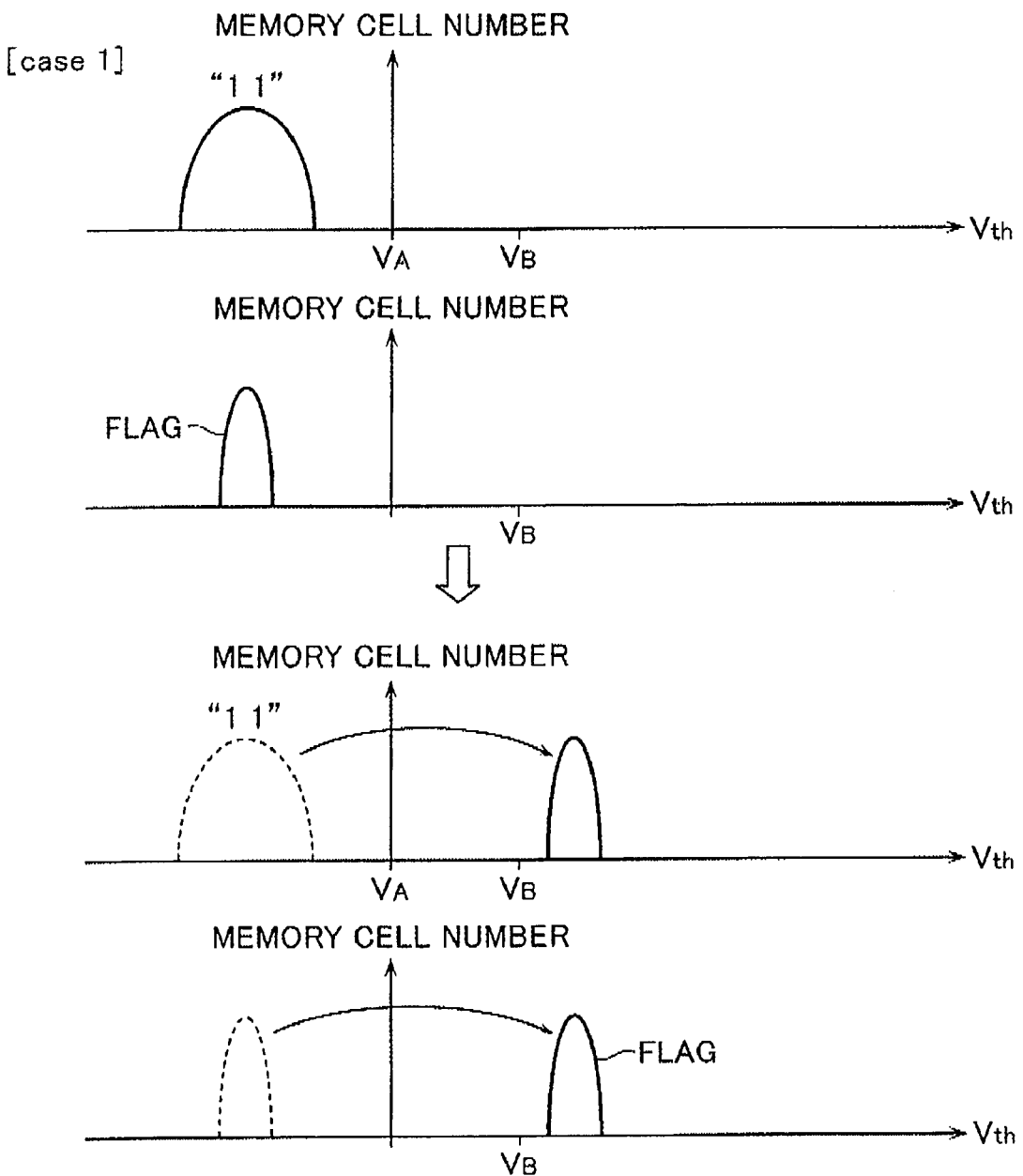
FIG. 14 is a schematic diagram illustrating a write operation of fault-block data.

In case 1, as shown in FIG. 14, the data of all memory cells MC in a block is in the erase state, i.e., it is data "11" (a negative threshold voltage). The flag data FLAG is "1." When it is instructed to start the fault-block data write mode, the write and verify operations are repeated so that, in all or specific memory cells in a block, the negative threshold voltage of the data "11" changes to the potential VB or more. Because the flag data is "1" (a negative threshold voltage), the flag cell FC is rewritten so that the flag data changes to data "0" having the potential VB or more.

Figure 15:
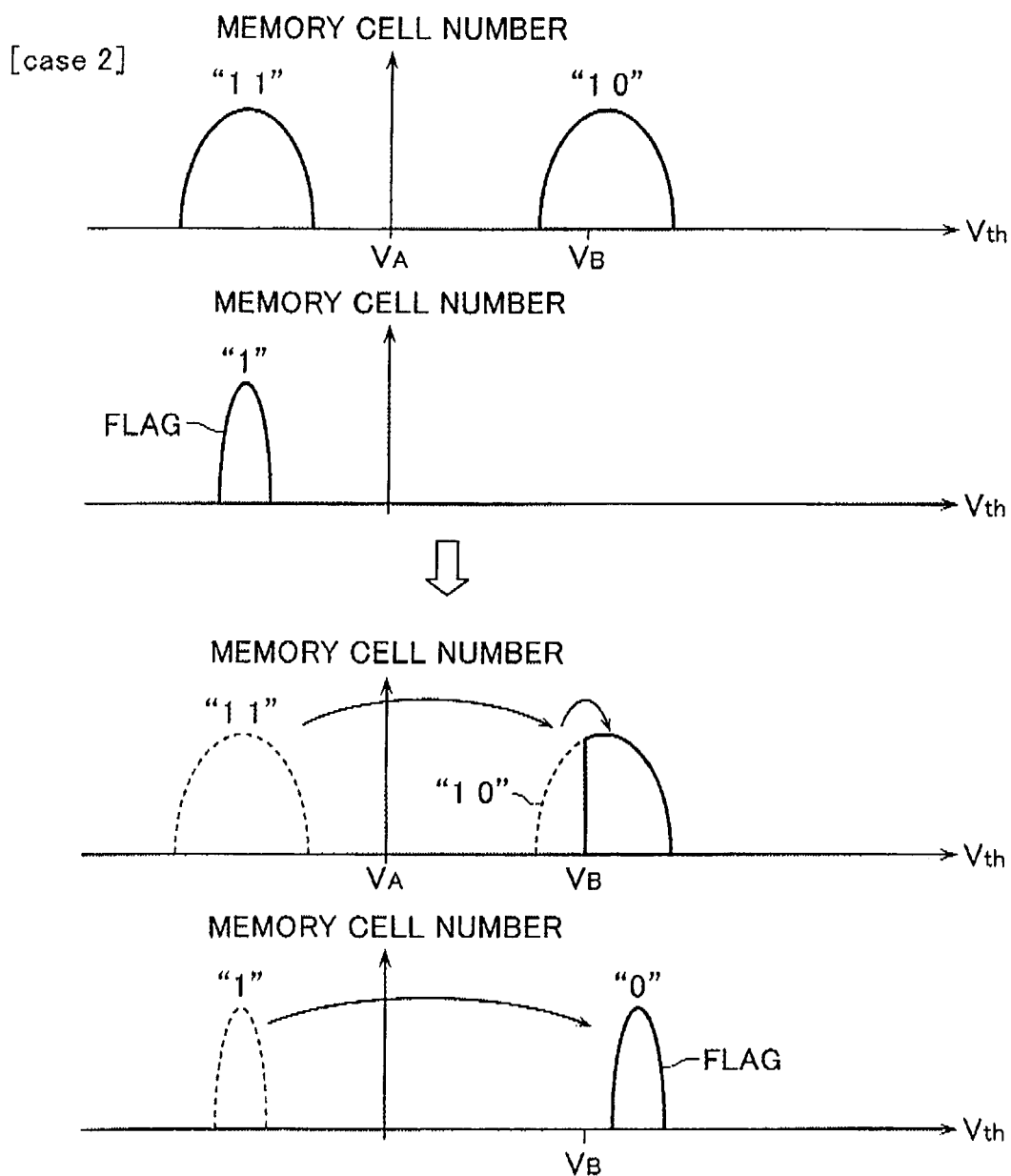
FIG. 15 is another schematic diagram illustrating a write operation of fault-block data.

In case 2, as shown in FIG. 15, the data of the memory cells MC in a block is data "11" or "10" (the data has a wider threshold distribution because the write operation affects the adjacent cells). The flag data FLAG is "1." When it is instructed to start the fault-block data write mode, the write and verify operations are repeated so that the memory cells of data "11" and "10" both have a threshold voltage of the potential VB or more. For the memory cells of data "10," only some of them have a threshold voltage below the potential VB and the others have the potential VB or more. Therefore, the write and verify operations are repeated only for the memory cells below the potential VB so that the threshold voltage changes to the potential VB or more (after the write operation is complete, the threshold voltage distribution of the data "10" is the binomial distribution curve that is cut off at VB, as shown in the lower curve in FIG. 15). Because the flag data is "1" (a negative threshold voltage), the flag cell FC is rewritten so that the flag data changes to data "0" having the potential VB or more.

Figure 16:
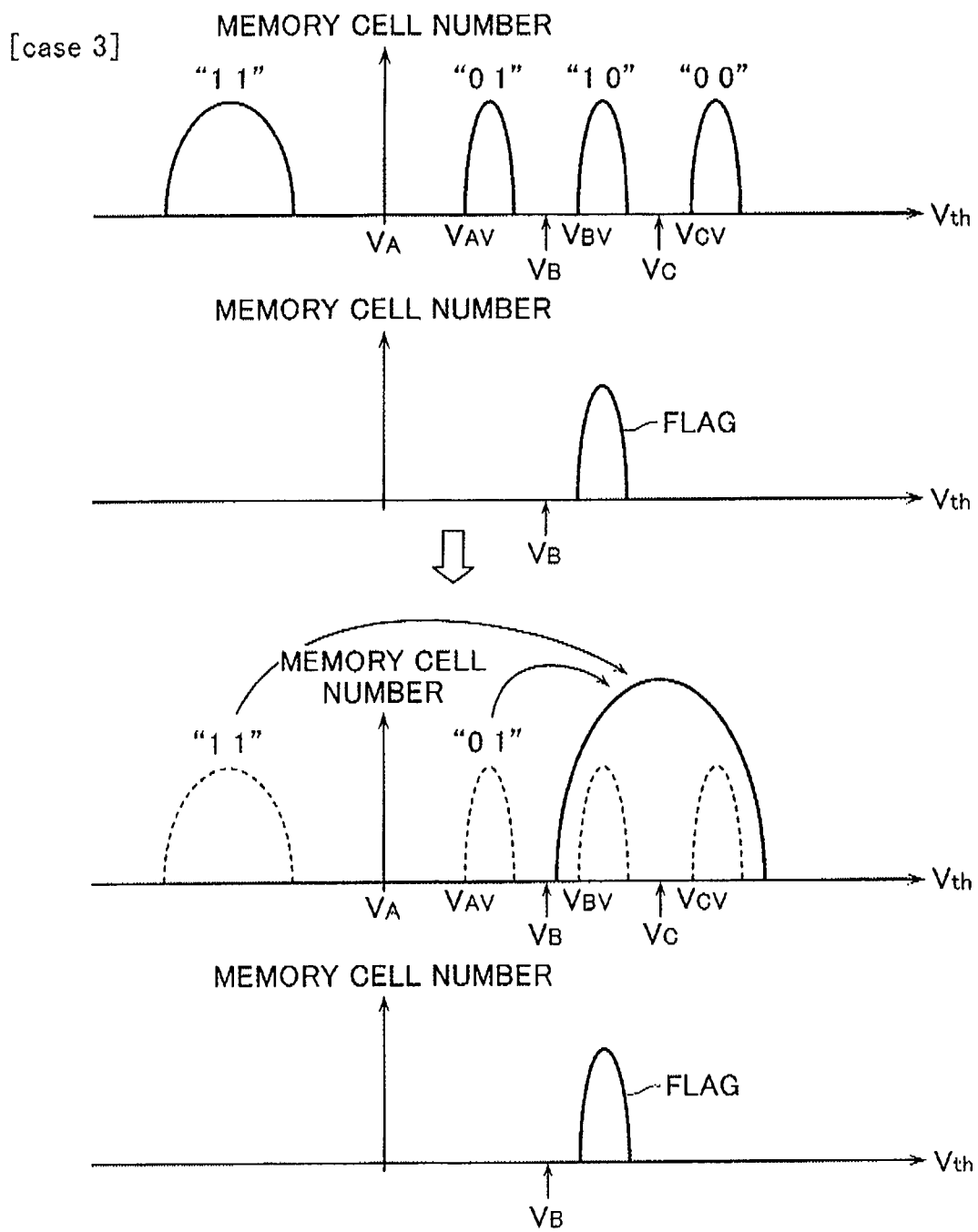
FIG. 16 is another schematic diagram illustrating a write operation of fault-block data.

In case 3, as shown FIG. 16, the data of the memory cells MC in a block is data "11," "01," "10," or "00." The flag data FLAG is "0." When it is instructed to start the fault-block data write mode, the write and verify operations are repeated so that the memory cells of data "11" and "01" have a threshold voltage of the potential VB or more. The four threshold voltage distributions are thus put together into one distribution.

Figure 17:
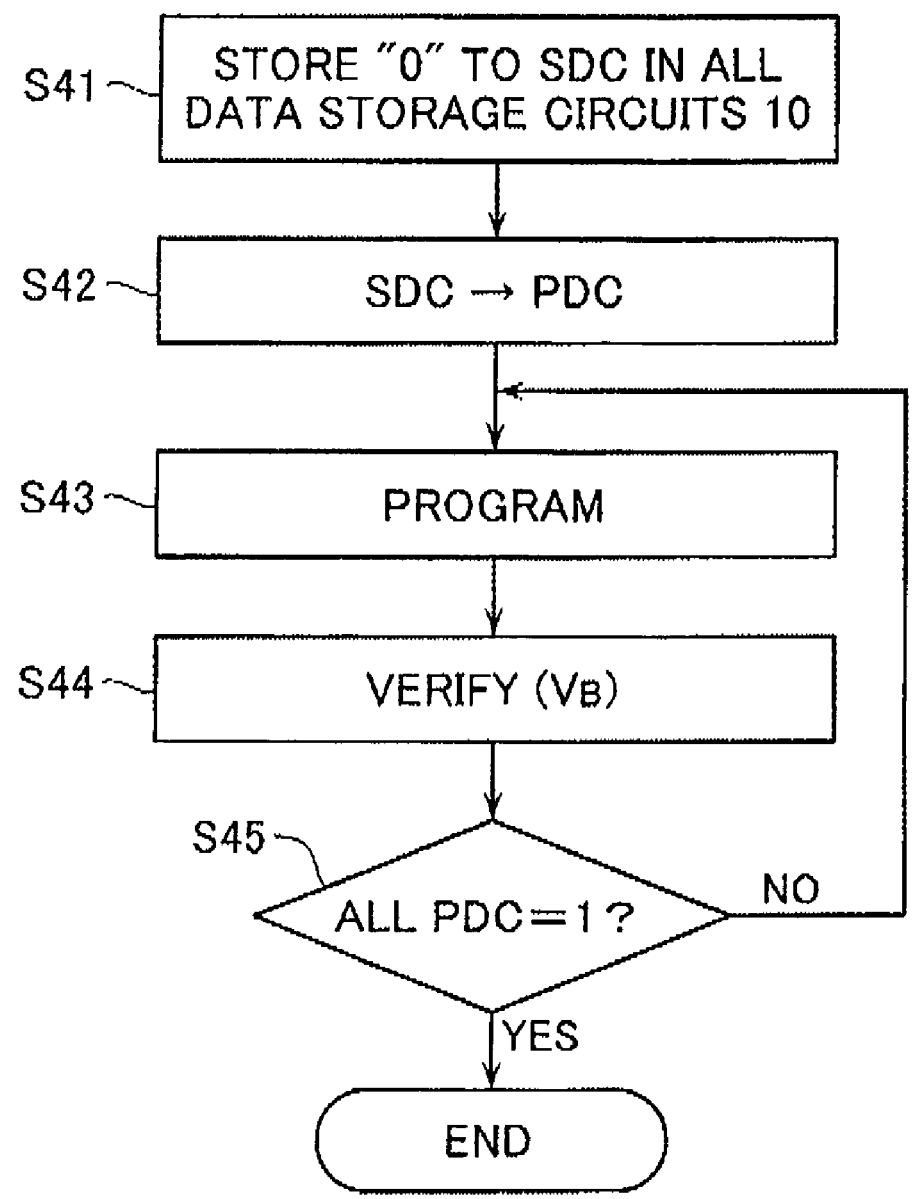
FIG. 17 is a flowchart of a process of a write operation of fault-block data.

The fault-block data write process in cases 1 to 3 is described below with reference to FIG. 17. First, the address of the fault block is assigned, and the SDC in all data storage circuits 10 stores "0" (S41). Then, in response to a command input, the SDC data is transferred to the PDC (S42). Because all data is "0," the nodes N1a of the PDCs all change to "L." Note that also in the flag data storage circuits 10a, the SDCs store "0" and the PDC's nodes N1a change to "L."

The operation then shifts to a lower page data write (program) operation to a memory cell MC (S43). Specifically, the transistor 61h, 61t, 61v, or 61w turns on, thus supplying data "0" held in PDC to the bit-line BLi or BLi+1. The bit-line potential is changed to Vss (ground potential). To avoid the unselected page cells from being written, the unselected page's bit-lines are also supplied with Vdd.

The select line SG1 of the selected block (the fault block to be written with "0") is applied with Vdd. The word-line of the selected cell is applied with the potential VPGM (20V). The word-line of the unselected cell is applied with the potential VPASS (10V). This allows write to the selected cells and avoids the unselected cells from being written.

The operation then shifts to a write verify operation (S44). First, the unselected word-line and the select line SG1 are provided with the potential Vread for a read operation, and the bit-line is precharged to 1V. The selected word-line is provided with a verify potential equal to the potential VB applied to the selected word-line in the lower page read operation. The select line SG2 on the source side of the memory cell is then changed to "H."

When the memory cell MC has a threshold voltage higher than the verify potential VB, the memory cell MC maintains the off state, thus leaving the bit-line "H." Then, similar to the lower page data write operation, when the PDC is "L," the write operation is performed again and the program and verify operations are repeated until all data storage circuits 10 have data of "H" (S45-S43).

Figure 18:
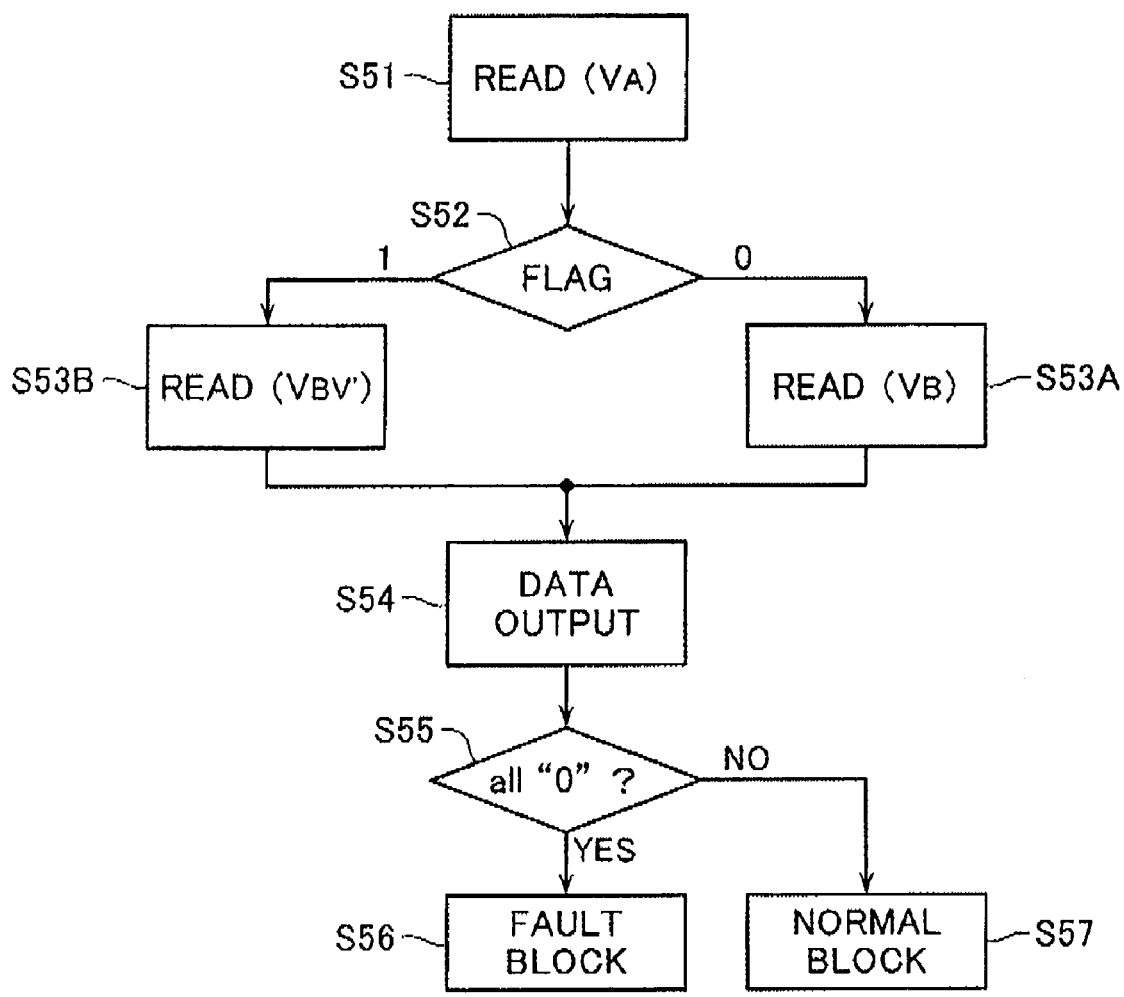
FIG. 18 is a flowchart of a detection process of fault block.

FIG. 18 is a flowchart of the fault block detection process. When one sector in a certain block is selected by the address assignment as the sector to be read, the word-line is first applied with the potential VA and the data read operation is performed (S51). The read operation allows the flag data FLAG to be read from the flag cell PC. When the fault-block data is already written, the flag data FLAG is "0." When it is determined that the FLAG is "0" (S52), the selected word-line potential is switched to VB (S53A), and the data read by the word-line potential VB is stored in the data storage circuit 10 and output outside (S54). When the data output is all "0", it is determined that the block including the relevant sector is a fault block (S56), and otherwise it is determined that the block is the normal block (S57).

Note that when it is determined at S52 that the flag data FLAG is "1," the selected word-line potential is set to VBv', i.e., to the verify potential in the lower page data write operation (353B), and then S54 to S57 are performed as described above.

SECOND EMBODIMENT

A four-value storage NAND cell type flash memory according to a second embodiment of the present invention is described with reference to FIG. 19. A NAND cell type flash memory of this embodiment has a circuit configuration similar to that in the first embodiment as shown in FIGS. 4 to 9. The flash memory of this embodiment also has a four-value data write operation process and a read operation process and the like similar to those in the first embodiment as shown in FIGS. 10 to 13.

Figure 19:
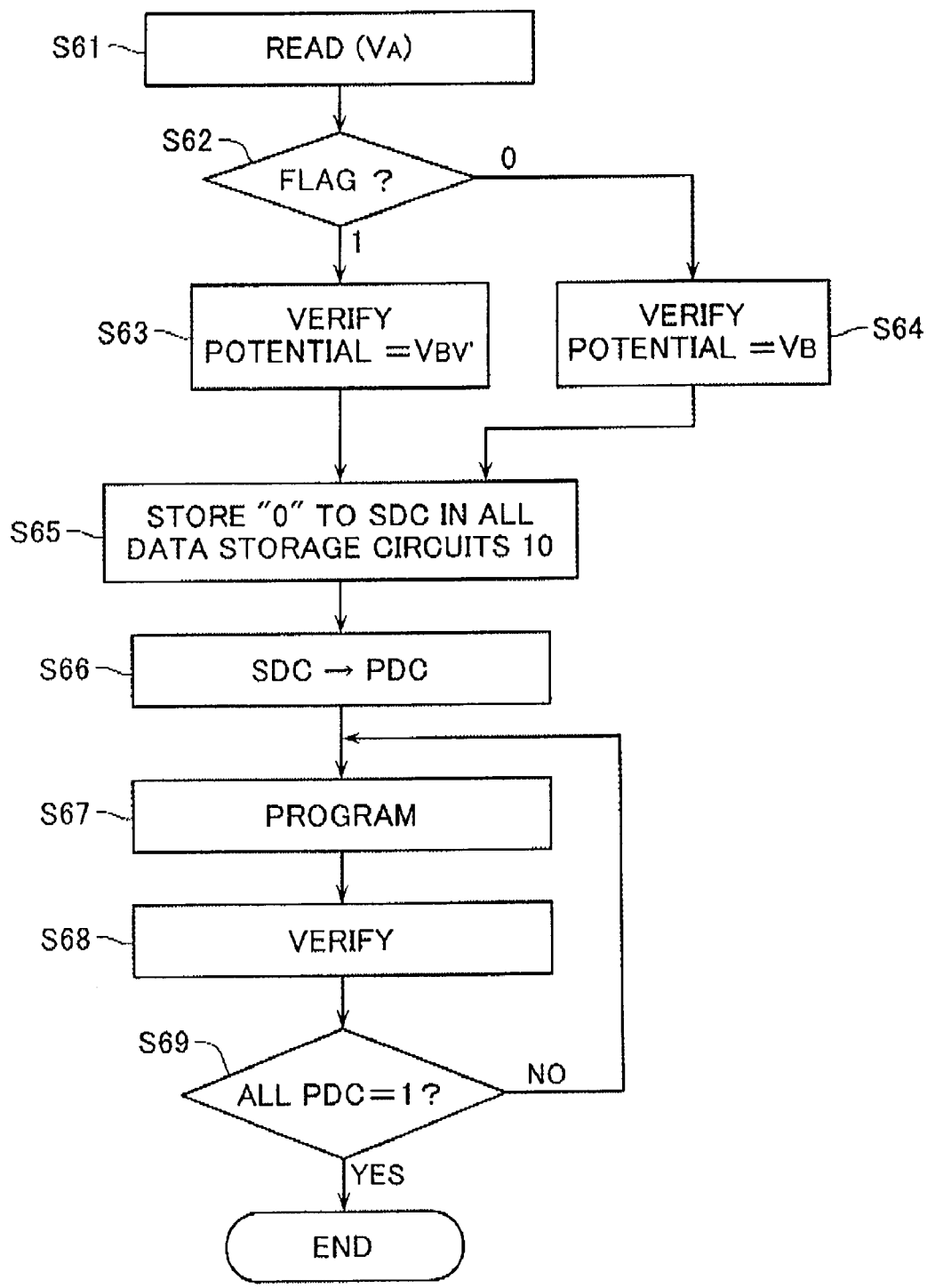
FIG. 19 is a flowchart of an operation according to a second embodiment of the present invention.

Note, however, that in this embodiment, as shown in FIG. 19, the fault block write operation is preceded by setting the word-line voltage to VA to read the flag data FLAG (S61 and S62). When FLAG="1," the upper page data write operation is not complete, then the verify potential is set to VBv' (S63). When FLAG="0," the upper page data write operation is complete, then the verify potential is set to VB (S64).

The following process S65 to S69 are similar to those in the normal lower page data write operation (S11 to S15 in FIG. 10). Specifically, the SDC in all data storage circuits 10 stores data "0" as the fault-block data (S65). The SDC data is then transferred to the PDC (S66). Note that when the verify potential is set to VB, the data storage circuit 10a also stores data "0" so that the flag data FLAG is rewritten to "0." When the verify potential is set to VBv', the data storage circuit 10a also stores data "1" so that the flag data FLAG maintains "1."

Then, the memory cell MC write (program) operation (S67) and the write verify operation by the verify potential that is set at S63 or S64 (S68) are repeated until all data storage circuits 10 have data of "H" (S69).

Thus, although the invention has been described with respect to particular embodiments thereof, it is not limited to those embodiments. It will be understood that various modifications and additions and the like may be made without departing from the spirit of the present invention. Although, for example, the embodiments use the NAND cell type flash memory, the present invention is not limited thereto and may also be applied to a memory that stores data using the threshold voltage distribution and writes and reads data in a certain memory unit such as the one sector. The fault-block data write operation may start a special fault block write mode or perform the normal data write mode.

Although, the embodiments use the two-bit storage (four-value storage) flash memory, the present invention is not limited thereto and may also be applied to a memory that stores two-bit data or more using the threshold voltage difference. In any event, the write operation may be performed so that all or specific memory cells in a fault block has a threshold voltage higher than the word-line voltage applied to the selected word-line when reading the first written page data among a plurality of sets of page data.

What is claimed is:

1. A non-volatile semiconductor storage device comprising:
a memory cell array comprising a plurality of memory cells enabled to store multi-value data, the memory cells being arranged along a plurality of bit-lines and a plurality of word-lines;
a bit-line control circuit including data storage circuits connected to the bit-lines and each storing one of a plurality of sets of page data included in the multi-value data, the bit-line control circuit controlling bit-line voltages applied to the bit-lines;
a word-line control circuit controlling word-line voltages applied to the word-lines; and
a control circuit controlling the word-line control circuit and the bit-line control circuits according to a control signal from outside,
the control circuit being able to perform a mode in which, all or specific memory cells in a fault block are written so that all or specific memory cells in the fault block have a threshold voltages higher than a first voltage applied to a selected word line when reading a first page of the sets of page data.

2. The non-volatile semiconductor device according to claim 1, wherein the memory cells connected in series and two selection gates connected to both ends thereof form a NAND cell, and each block includes a plurality of the NAND cells.

3. The non-volatile semiconductor storage device according to claim 1, further comprising:
a flag cell storing flag data, the flag data being selected concurrently with the memory cells respectively selected by the word-lines and indicating a write situation of multi-value data to the memory cells; and
a flag data storage circuit storing the flag data to be written to the flag cell.

4. The non-volatile semiconductor storage device according to claim 3, wherein when a write operation to an upper page compared to the first page is complete, the flag data is rewritten.

5. The non-volatile semiconductor storage device according to claim 1, wherein, in a data write operation to distinguish the fault block, the control circuit allows the data storage circuits to hold first data, the data storage circuit being connected to the memory cell to be written with the data, changes data held in the data storage circuit from the first data to second data when a verify operation senses that a write of the first data to the memory cell is complete, and repeats the write operation until all data storage circuits hold the second data.

6. The non-volatile semiconductor device according to claim 5, wherein the memory cells connected in series and two selection gates connected to both ends thereof form a NAND cell, and each block includes a plurality of NAND cells.

7. The non-volatile semiconductor storage device according to claim 6, wherein the flag data is rewritten when among a plurality of sets of page data included in multi-value data, a write operation of an upper page compared to the first page is complete.

8. The non-volatile semiconductor storage device according to claim 3, wherein in a data write operation to distinguish the fault block, when a write operation to an upper page compared to the first page is not complete, a verify potential is set to a first potential, and when a write operation to the upper page compared to the first page is complete, the verify potential is set to a second potential higher than the first potential.

9. The non-volatile semiconductor storage device according to claim 1, further comprising a determination circuit that determines, when among the sets of page data an first page data is read, and when it is detected that all or specific memory cells in a predetermined block in the memory cell array all have a threshold voltage higher than the first voltage, the block as a fault block.

10. The non-volatile semiconductor storage device according to claim 9, further comprising:
    a flag cell storing flag data, the flag data being selected concurrently with the memory cells respectively selected by the word-lines and indicating a write situation of multi-value data to the memory cells; and
    a flag data storage circuit storing the flag data to be written to the flag cell.

11. The non-volatile semiconductor device according to claim 9, wherein the memory cells connected in series and two selection gates connected to both ends thereof form a NAND cell, and each block includes a plurality of NAND cells.

12. The non-volatile semiconductor storage device according to claim 10, wherein the flag data is rewritten when among a plurality of sets of page data included in multi-value data, a write operation to an upper page compared to the first page is complete.

\* \* \* \* \*